(12) United States Patent
Kellerman et al.

(10) Patent No.: US 7,855,087 B2
(45) Date of Patent: *Dec. 21, 2010

(54) FLOATING SHEET PRODUCTION APPARATUS AND METHOD

(75) Inventors: Peter L. Kellerman, Essex, MA (US); Frank Sinclair, Quincy, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 44 days.

This patent is subject to a terminal disclaimer.

(21) Appl. No.: 12/403,206

(22) Filed: Mar. 12, 2009

(65) Prior Publication Data

US 2009/0233396 A1  Sep. 17, 2009

Related U.S. Application Data

(60) Provisional application No. 61/036,555, filed on Mar. 14, 2008.

(51) Int. Cl.
*H01L 21/00* (2006.01)

(52) U.S. Cl. .............. 438/15; 438/19; 438/29; 438/34; 257/E21.001; 257/E21.012; 257/E21.121; 257/E21.141; 257/E21.586

(58) Field of Classification Search ............ 438/15–19, 438/29–34, 98–112; 257/E21.001, E21.012, 257/E21.121, E21.141, E21.585, E21.586
See application file for complete search history.

(56) References Cited

U.S. PATENT DOCUMENTS

| | | |
|---|---|---|
| 3,430,680 A | 3/1969 | Leghorn |
| 3,607,115 A | 9/1971 | Bleil |
| 3,681,033 A | 8/1972 | Blyeil |
| 3,759,671 A | 9/1973 | Bleil |
| 4,121,965 A | 10/1978 | Leipold |
| 4,152,387 A * | 5/1979 | Cloeren .................. 264/173.13 |
| 4,226,834 A | 10/1980 | Shudo et al. |
| 4,264,407 A | 4/1981 | Shudo et al. |
| 4,289,571 A | 9/1981 | Jewett |
| 4,316,764 A | 2/1982 | Kudo et al. |
| 4,322,263 A | 3/1982 | Kudo et al. |
| 4,329,195 A | 5/1982 | Kudo |

(Continued)

FOREIGN PATENT DOCUMENTS

JP  09-099359 A  4/1997

(Continued)

OTHER PUBLICATIONS

D.N. Jewett et al., "Progress in Growth of Silicon Ribbon by a Low Angle, High Rate Process," 16th Photovoltaic Specialists Conference, San Diego, CA, Sep. 27-30, 1982, pp. 86-89, Institute of Electrical and Electronics Engineers, New York, NY, USA.

(Continued)

*Primary Examiner*—Michael S Lebentritt

(57) ABSTRACT

This sheet production apparatus comprises a vessel defining a channel configured to hold a melt. The melt is configured to flow from a first point to a second point of the channel. A cooling plate is disposed proximate the melt and is configured to form a sheet on the melt. A spillway is disposed at the second point of the channel. This spillway is configured to separate the sheet from the melt.

20 Claims, 13 Drawing Sheets

U.S. PATENT DOCUMENTS

| | | | |
|---|---|---|---|
| 4,417,944 | A | 11/1983 | Jewett |
| 4,428,783 | A | 1/1984 | Gessert |
| 4,447,289 | A | 5/1984 | Geissler et al. |
| 4,555,293 | A * | 11/1985 | French ............... 156/308.4 |
| 4,594,229 | A | 6/1986 | Ciszek et al. |
| 4,599,132 | A | 7/1986 | Jewett et al. |
| 4,873,063 | A | 10/1989 | Bleil |
| 5,055,157 | A | 10/1991 | Bleil |
| 5,069,742 | A | 12/1991 | Bleil |
| 5,229,083 | A | 7/1993 | Bleil |
| 5,233,420 | A * | 8/1993 | Piri et al. ............... 348/513 |
| 5,370,078 | A * | 12/1994 | Kou et al. ............... 117/209 |
| 5,394,825 | A | 3/1995 | Schmid et al. |
| 5,705,111 | A * | 1/1998 | Blemberg et al. ...... 264/173.13 |
| 5,994,207 | A | 11/1999 | Henley et al. |
| 6,090,199 | A | 7/2000 | Wallace, Jr. et al. |
| 6,225,190 | B1 | 5/2001 | Bruel et al. |
| 7,026,634 | B2 * | 4/2006 | Livesay et al. ........... 250/492.3 |
| 2006/0213589 | A1 * | 9/2006 | Sawada et al. ............ 148/549 |
| 2007/0012573 | A1 * | 1/2007 | Sawada et al. ............ 205/153 |
| 2008/0134964 | A1 | 6/2008 | Harvey et al. |
| 2010/0038826 | A1 * | 2/2010 | Kellerman et al. ........ 264/430 |
| 2010/0080905 | A1 * | 4/2010 | Sinclair ............... 427/255.395 |

FOREIGN PATENT DOCUMENTS

| | | |
|---|---|---|
| JP | 2001-260217 A | 9/2001 |
| JP | 2003-117638 A | 4/2003 |

OTHER PUBLICATIONS

B. Kudo, "Improvements in the Horizontal Ribbon Growth Technique for Single Crystal Silicon," Journal of Crystal Growth 50, 1980, pp. 247-259, North-Holland Publishing Co., Amsterdam, Netherlands.

Bruce Chalmers, "High Speed Growth of Sheet Crystals," Journal of Crystal Growth 70, 1984, pp. 3-10, North-Holland Publishing Co., Amsterdam, Netherlands.

Paul D. Thomas & Robert A. Brown, "Rate Limits in Silicon Sheet Growth: The Connections Between Vertical and Horizontal Methods," J. of Crystal Growth 82, 1987, pp. 1-9, North-Holland Publishing Co., Amsterdam, Netherlands.

T.F. Ciszek, "Techniques for the Crystal Growth of Silicon Ingots and Ribbons," J. of Crystal Growth 66, 1984, pp. 655-672, North-Holland Publishing Co., Amsterdam, Netherlands.

M.E. Glicksman & P.W. Voorhees, "Analysis of Morphologically Stable Horizontal Ribbon Crystal Growth," J. of Electronic Materials, vol. 12, No. 1, 1983, pp. 161-179, Springer Science+Business Media, Cambridge, MA, USA.

William C. Dash, "Growth of Silicon Crystals Free from Dislocations," J. of App. Phys., vol. 30, No. 4, Apr. 1959, pp. 459-474 American Institute of Physics, Melville, NY, USA.

* cited by examiner

FLOATING SHEET PRODUCTION APPARATUS AND METHOD

CROSS-REFERENCE TO RELATED APPLICATIONS

This application claims priority to the provisional patent application entitled "Silicon Floating Sheet Method," filed Mar. 14, 2008 and assigned U.S. App. No. 61/036,555, the disclosure of which is hereby incorporated by reference.

FIELD

This invention relates to producing a sheet of material and, more particularly, to producing a sheet of crystalline material from a melt.

BACKGROUND

Silicon wafers or sheets may be used in, for example, the integrated circuit or solar cell industry. Demand for solar cells continues to increase as the demand for renewable energy sources increases. As these demands increase, one goal of the solar cell industry is to lower the cost/power ratio. There are two types of solar cells: crystalline silicon and thin film. The majority of solar cells are made from crystalline silicon. Currently, a major cost of a crystalline silicon solar cell is the wafer on which the solar cell is made. The efficiency of the solar cell, or the amount of power produced under standard illumination, is limited, in part, by the quality of this wafer. Any reduction in the cost of manufacturing a wafer without decreasing quality will lower the cost/power ratio and enable the wider availability of this clean energy technology.

The highest efficiency solar cells may have an efficiency of greater than 20%. These are made using electronics-grade monocrystalline silicon wafers. Such wafers may be made by sawing thin slices from a monocrystalline silicon cylindrical boule grown using the Czochralski method. These slices may be less than 200 µm thick. To maintain single crystal growth, the boule must be grown slowly, such as less than 10 µm/s, from a crucible containing a melt. The subsequent sawing process leads to approximately 200 µm of kerf loss, or loss due to the width of a saw blade, per wafer. The cylindrical boule also may need to be squared off to make a square solar cell. Both the squaring and kerf losses lead to material waste and increased material costs. As solar cells become thinner, the percent of silicon waste per cut increases. Limits to ingot slicing technology, however, may hinder the ability to obtain thinner solar cells.

Other solar cells are made using wafers sawed from polycrystalline silicon ingots. Polycrystalline silicon ingots may be grown faster than monocrystalline silicon. However, the quality of the resulting wafers is lower because there are more defects and grain boundaries. This results in lower efficiency solar cells. The sawing process for a polycrystalline silicon ingot is as inefficient as a monocrystalline silicon ingot or boule.

Another solution that may reduce silicon waste is cleaving a wafer from a silicon ingot after ion implantation. For example, hydrogen, helium, or other noble gas ions are implanted beneath the surface of the silicon ingot to form an implanted region. This is followed by a thermal, physical, or chemical treatment to cleave the wafer from the ingot along this implanted region. While cleaving through ion implantation can produce wafers without kerf losses, it has yet to be proven that this method can be employed to produce silicon wafers economically.

Yet another solution is to pull a thin ribbon of silicon vertically from a melt and then allow the pulled silicon to cool and solidify into a sheet. The pull rate of this method may be limited to less than approximately 18 mm/minute. The removed latent heat during cooling and solidifying of the silicon must be removed along the vertical ribbon. This results in a large temperature gradient along the ribbon. This temperature gradient stresses the crystalline silicon ribbon and may result in poor quality multi-grain silicon. The width and thickness of the ribbon also may be limited due to this temperature gradient. For example, the width may be limited to less than 80 mm and the thickness may be limited to 180 µm.

Horizontal ribbons of silicon that are physically pulled from a melt also have been tested. A seed attached to a rod is inserted into the melt and the rod and resulting sheet are pulled at a low angle over the edge of the crucible. The angle and surface tension are balanced to prevent the melt from spilling over the crucible. It is difficult, however, to initiate and control such a pulling process. Access must be given to the crucible and melt to insert the seed, which may result in heat loss. Additional heat may be added to the crucible to compensate for this heat loss. This may cause vertical temperature gradients in the melt that may cause non-laminar fluid flow. Convective gas cooling may be used due to the large heat flow into the melt. Such convective cooling may be turbulent. The non-laminar flow of the gas and melt may prevent control of the thickness of the sheet. Furthermore, a possibly difficult angle of inclination adjustment to balance gravity and surface tension of the meniscus formed at the crucible edge must be performed. Also, since heat is being removed at the separation point of the sheet and melt, there is a sudden change between heat being removed as latent heat and heat being removed as sensible heat. This may cause a large temperature gradient along the ribbon at this separation point and may cause dislocations in the crystal. Dislocations and warping may occur due to these temperature gradients along the sheet.

Production of thin sheets separated horizontally from a melt has not been performed. Producing sheets horizontally from a melt by separation may be less expensive than silicon sliced from an ingot and may eliminate kerf loss or loss due to squaring. Sheets produced horizontally from a melt by separation also may be less expensive than silicon cleaved from an ingot using hydrogen ions or other pulled silicon ribbon methods. Furthermore, separating a sheet horizontally from a melt may improve the crystal quality of the sheet compared to pulled ribbons. A crystal growth method such as this that can reduce material costs would be a major enabling step to reduce the cost of crystalline solar cells. Accordingly, there is a need in the art for an improved apparatus and method to produce a sheet of crystalline material from a melt.

SUMMARY

According to a first aspect of the invention, a sheet production apparatus is provided. The sheet production apparatus comprises a vessel defining a channel configured to hold a melt of a material. The melt is configured to flow from a first point to a second point of the channel. A cooling plate is disposed proximate the melt and is configured to form a sheet of the material on the melt. A spillway is disposed at the second point of the channel. The spillway is configured to separate the sheet from the melt.

According to a second aspect of the invention, a sheet production method is provided. The sheet production method comprises flowing a melt of a material through a channel. The melt is cooled and a sheet of the material forms on the melt. The sheet and the melt flow and the sheet is separated from the melt.

According to a third aspect of the invention, a sheet production apparatus is provided. The sheet production apparatus comprises a first channel configured to hold a melt of a material. The melt is configured to flow from a first point to a second point of the first channel. A cooling plate is disposed proximate the first channel and is configured to form a sheet of the material on the melt. A spillway is disposed at the second point of the first channel. The spillway is disposed within the melt and is configured to separate the sheet from the melt wherein the melt flows away from the sheet. The melt is transported to the first point of the first channel in a second channel.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the apparatus and methods herein are described in connection with solar cells. However, these also may be used to produce, for example, integrated circuits, flat panels, or other substrates known to those skilled in the art. Furthermore, while the melt is described herein as being silicon, the melt may contain germanium, silicon and germanium, or other materials known to those skilled in the art. Thus, the invention is not limited to the specific embodiments described below.

Figure 1:
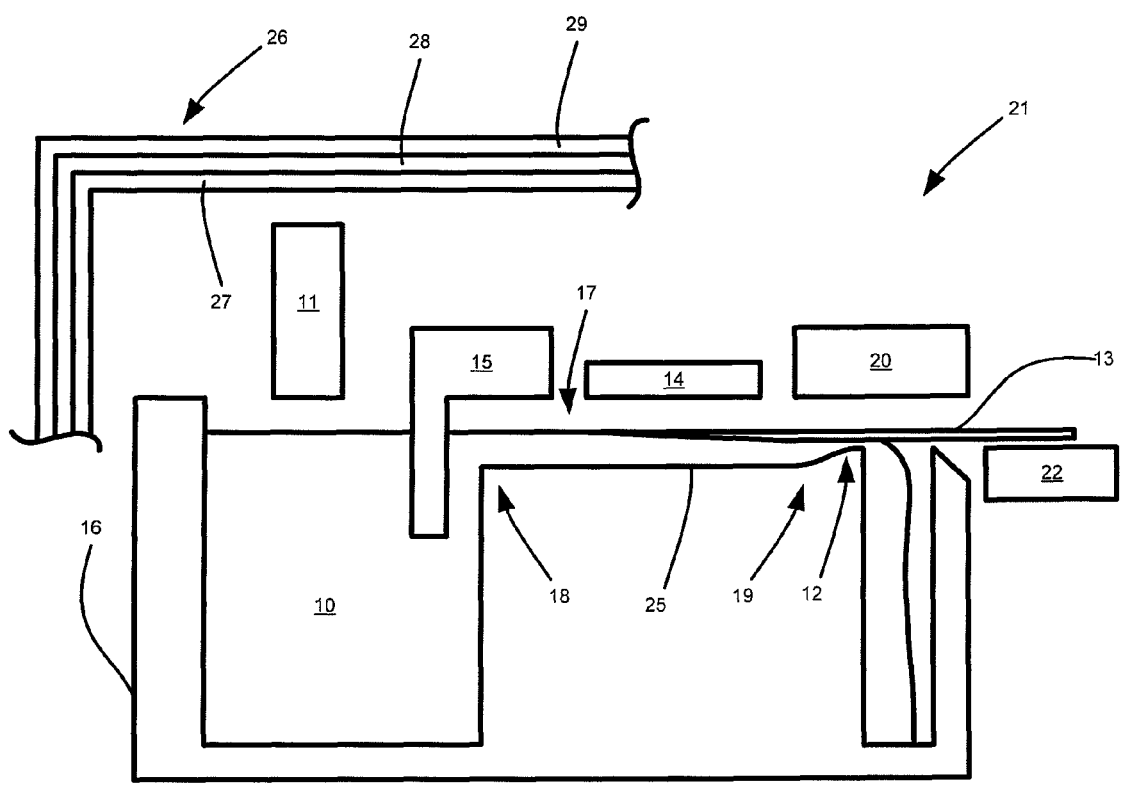
FIG. 1 is a cross-sectional side view of an embodiment of an apparatus that separates a sheet from a melt.

FIG. 1 is a cross-sectional side view of an embodiment of an apparatus that separates a sheet from a melt. The sheet-forming apparatus 21 has a vessel 16 and panels 15 and 20. The vessel 16 and panels 15 and 20 may be, for example, tungsten, boron nitride, aluminum nitride, molybdenum, graphite, silicon carbide, or quartz. The vessel 16 is configured to contain a melt 10. The melt 10 may be silicon. The melt 10 may be replenished through the feed 11 in one embodiment. The feed 11 may contain solid silicon. The melt 10 may be pumped into the vessel 16 in another embodiment. A sheet 13 will be formed on the melt 10. In one instance, the sheet 13 will at least partly float within the melt 10. While the sheet 13 is illustrated in FIG. 1 as floating in the melt 10, the sheet 13 may be at least partially submerged in the melt 10 or may float on top of the melt 10. In one instance, only 10% of the sheet 13 protrudes from above the top of the melt 10.

This vessel 16 defines at least one channel 17. This channel 17 is configured to hold the melt 10 and the melt 10 flows from a first point 18 to a second point 19 of the channel 17. In one instance, the environment within the channel 17 is still to prevent ripples in the melt 10. The melt 10 may flow due to, for example, a pressure difference, gravity, or other methods of transport. The melt 10 then flows over the spillway 12. This spillway 12 may be a ramp, a weir, a small dam, or a corner and is not limited to the embodiment illustrated in FIG. 1. The spillway 12 may be any shape that allows a sheet 13 to be separated from the melt 10.

The panel 15 is configured in this particular embodiment to extend in part below the surface of the melt 10. This may prevent waves or ripples from disturbing the sheet 13 as it forms on the melt 10. These waves or ripples may form due to addition of melt material from the feed 11, pumping, or other causes known to those skilled in the art.

In one particular embodiment, the vessel 16 and panels 15 and 20 may be maintained at a temperature slightly above approximately 1687 K. For silicon, 1687 K represents the crystallization temperature ($T_c$). By maintaining the temperature of the vessel 16 and panels 15 and 20 to slightly above $T_c$, the cooling plate 14 may function using radiation cooling to obtain the desired freezing rate of the sheet 13 on or in the melt 10. The cooling plate 14 in this particular embodiment is composed of a single segment or section. The bottom 25 of the channel 17 may be heated above $T_c$ to create a small vertical temperature gradient in the melt 10 to prevent constitutional supercooling or the formation of dendrites, or branching projections, on the sheet 13. However, the vessel 16 and panels 15 and 20 may be any temperature above the melting temperature of the melt 10. This prevents the melt 10 from solidifying on the vessel 16 and panels 15 and 20.

The apparatus 21 may be maintained at a temperature slightly above $T_c$ by at least partially or totally enclosing the apparatus 21 within an enclosure 26. While FIG. 1 illustrates the enclosure 26 as only partially surrounding or enclosing the apparatus 21, the enclosure may totally enclose the apparatus 21 and the apparatus 21 is not limited solely to the embodiment illustrated in FIG. 1. If the enclosure 26 maintains the apparatus 21 at a temperature above $T_c$, the need to heat the apparatus 21 may be avoided or reduced and heaters in or around the enclosure 26 may compensate for any heat loss. This enclosure 26 may be isothermal with non-isotropic conductivity. Such an enclosure 26 may be constructed using a liner 27, a layer 28 with heaters, and insulation 29, although other designs are possible as is known to those skilled in the art. The liner 27 may conduct heat and may be BN in one instance. The layer 28 with heaters may include, for example, RF inductive heating or other heating methods known to those skilled in the art. In another particular embodiment, the heaters are not disposed on or in the enclosure 26 and are rather in the apparatus 21. In one instance, different regions of the vessel 16 may be heated to different temperatures by imbedding heaters within the vessel 16 and using multi-zone temperature control.

The enclosure 26 may control the environment where the apparatus 21 is disposed. In a specific embodiment, the enclosure 26 contains an inert gas. This inert gas may be maintained at above $T_c$. The inert gas may reduce the addition of solutes into the melt 10 that may cause constitutional instabilities during the sheet 13 formation process.

The apparatus 21 includes a cooling plate 14. The cooling plate 14 allows heat extraction as the sheet 13 forms on the melt 10. The cooling plate 14 may cause the sheet 13 to freeze on or in the melt 10 when the cooling plate 14 is lowered below the freezing temperature of the melt 10. This cooling plate 14 may use radiation cooling and may be fabricated of, for example, graphite or silicon carbide. The cooling plate 14 may remove heat from the liquid melt 10 quickly, uniformly, and in controlled amounts. Disturbances to the melt 10 may be reduced while the sheet 13 forms to prevent imperfections.

The heat extraction of the heat of fusion over the surface of the melt 10 may enable faster production of the sheet 13 compared to other ribbon pulling methods while maintaining a sheet 13 with low defect density. Cooling a sheet 13 on the surface of the melt 10 or a sheet 13 that floats on the melt 10 allows the latent heat of fusion to be removed slowly and over a large area while having a large horizontal flow rate. While vertical pulling of a sheet from a melt may have a crystal growth rate of greater than approximately 300 µm/s (18 mm/min), embodiments of the apparatus and method described herein may have a much lower crystal growth rate, close to that of Czochralski growth. The crystal growth rate may be less than approximately 10 µm/s in one instance. When a sheet is pulled vertically out of the melt surface, the latent heat must be removed along the sheet. The crystallization area, or sheet thickness multiplied by sheet width, may be small. A high temperature gradient is required to pull a sheet vertically at approximately 18 mm/min. Using such a vertical pull method may lead to a poor quality crystal. Cooling the sheet 13 on the surface of the melt 10 or a sheet 13 that floats on the melt 10, besides improving the quality of the sheet 13, also may increase the speed of production and size of the sheet 13 compared to ribbons pulled normal to the surface of a melt.

The dimensions of the cooling plate 14 may be increased, both in length and width. Increasing the length may allow a faster melt 10 flow rate for the same vertical growth rate and resulting sheet 13 thickness. Increasing the width of the cooling plate 14 may result in a wider sheet 13. Unlike the vertical sheet pulling method, there is no inherent physical limitation on the width of the sheet 13 produced using embodiments of the apparatus and method described herein.

In one particular example, the melt 10 and sheet 13 flow at a rate of approximately 1 cm/s. The cooling plate 14 is approximately 20 cm in length and approximately 25 cm in width. A sheet 13 may be grown to approximately 100 µm in thickness in approximately 20 seconds. Thus, the sheet may grow in thickness at a rate of approximately 5 µm/s. A sheet 13 of approximately 100 µm in thickness may be produced at a rate of approximately 10 $m^2$/hour.

Thermal gradients in the melt 10 may be minimized in one embodiment. This may allow the melt 10 flow to be laminar and may allow the sheet 13 to be formed via radiation cooling using the cooling plate 14. A temperature difference of approximately 300 K between the cooling plate 14 and the melt 10 may form the sheet 13 on or in the melt 10 at a rate of 7 µm/s.

The region of the channel 17 downstream from the cooling plate 14 and the under the panel 20 may be isothermal. This isothermal region may allow annealing of the sheet 13.

After the sheet 13 is formed on the melt 10, the sheet 13 is separated from the melt 10 using the spillway 12. The melt 10 flows from the first point 18 to the second point 19 of the channel 17. The sheet 13 will flow with the melt 10. This transport of the sheet 13 may be a continuous motion. In one instance, the sheet 13 may flow at approximately the same speed that the melt 10 flows. Thus, the sheet 13 may form and be transported while at rest with respect to the melt 10. The shape of the spillway 12 or orientation of the spillway 12 may be altered to change the velocity profile of the sheet 13.

The melt 10 is separated from the sheet 13 at the spillway 12. In one embodiment, the flow of the melt 10 transports the melt 10 over the spillway 12 and may, at least in part, transport the sheet 13 over the spillway 12. This may minimize or prevent breaking the crystal in the sheet 13 because no external stress is applied to the sheet 13. The melt 10 will flow over the spillway 12 away from the sheet 13 in this particular embodiment. Cooling may not be applied at the spillway 12 to prevent thermal shock to the sheet 13. In one embodiment, the separation at the spillway 12 occurs in near-isothermal conditions.

The sheet 13 may be formed faster in the apparatus 21 than by being pulled normal to the melt because the melt 10 may flow at a speed configured to allow for proper cooling and crystallization of the sheet 13 on the melt 10. The sheet 13 will flow approximately as fast as the melt 10 flows. This reduces stress on the sheet 13. Pulling a ribbon normal to a melt is limited in speed because of the stresses placed on the ribbon due to the pulling. The sheet 13 in the apparatus 21 may lack any such pulling stresses in one embodiment. This may increase the quality of the sheet 13 and the production speed of the sheet 13.

The sheet 13 may tend to go straight beyond the spillway 12 in one embodiment. This sheet 13 may be supported after going over the spillway 12 in some instances to prevent breakage. A support device 22 is configured to support the sheet 13. The support device 22 may provides a gas pressure differential to support the sheet 13 using, for example, a gas or air blower. After the sheet 13 is separated from the melt 10, the temperature of the environment where the sheet 13 is located may slowly be changed. In one instance, the temperature is lowered as the sheet 13 moves farther from the spillway 12.

In one instance, the growth of the sheet 13, annealing of the sheet 13, and separation of the sheet 13 from the melt 10 using the spillway 12 may take place in an isothermal environment. The separation using the spillway 12 and the approximately equal flow rates of the sheet 13 and melt 10 minimize stress or mechanical strain on the sheet 13. This increases the possibility of producing a single crystal sheet 13.

In another embodiment, a magnetic field is applied to the melt 10 and sheet 13 in the apparatus 21. This may dampen non-laminar flows within the melt 10 and may improve crystallization of the sheet 13.

Figure 2:
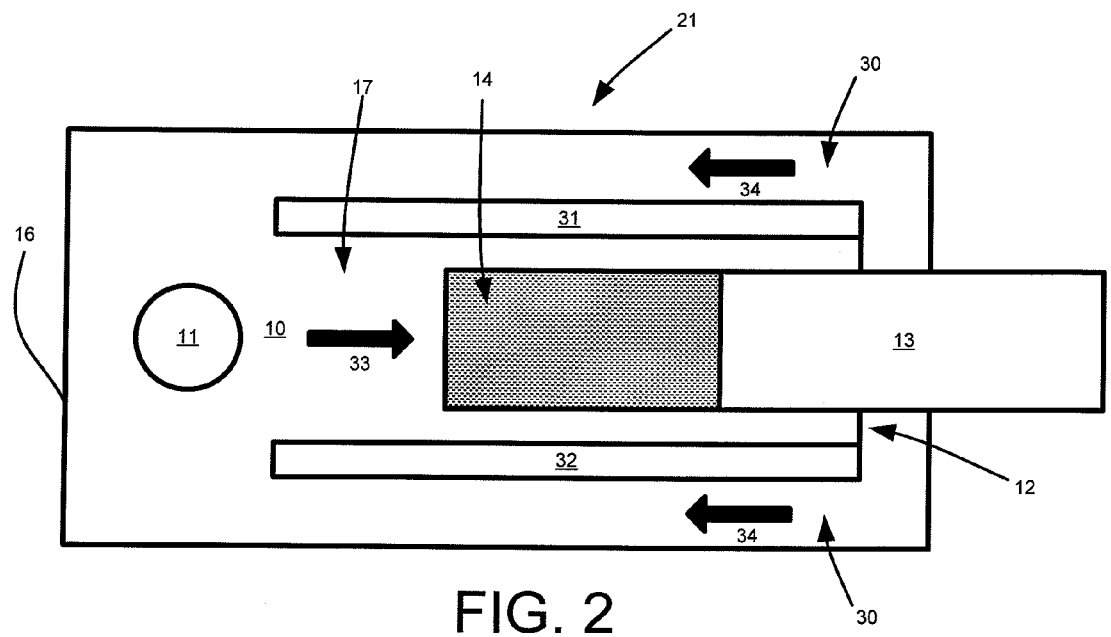
FIG. 2 is a top plan view of the embodiment of the apparatus shown in FIG. 1.
Figure 3:
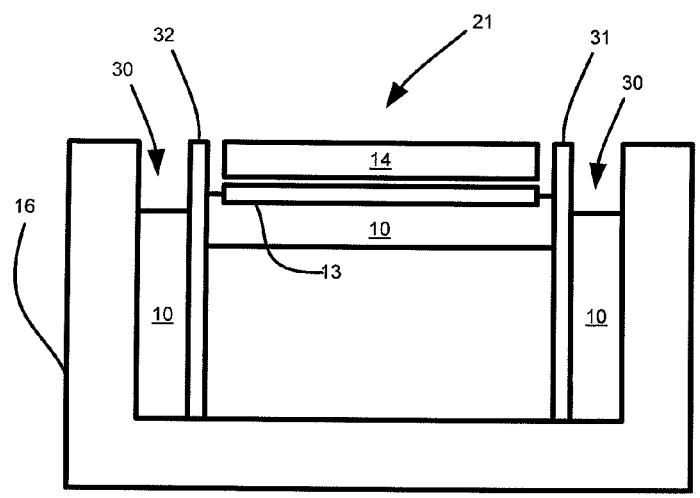
FIG. 3 is a cross-sectional front view of the embodiment of the apparatus shown in FIG. 1.

FIG. 2 is a top plan view of the embodiment of the apparatus shown in FIG. 1. FIG. 3 is a cross-sectional front view of the embodiment of the apparatus shown in FIG. 1. Both FIG. 2 and FIG. 3 illustrate the apparatus 21 with channels 30. As illustrated in FIG. 2, the melt 10 will flow through the channel 17 is indicated by arrow 33. The melt will flow past the cooling plate 14 (represented by the shaded region in FIG. 2) and the sheet 13 will form. As seen in FIGS. 2-3, the cooling plate 14 may not extend all the way to the walls 31, 32 that contain the melt 10. This may prevent a solid sheet 13 from forming against the walls 31, 32. The sheet 13 and melt 10 will flow over the spillway 12 and the sheet 13 will be separated from the melt 10. The melt 10 may then return to the region near the feed 11 using the channels 30 as indicated by arrows 34. While two channels 30 are illustrated, one channel or more than two channels may be used. This apparatus is not solely limited to two channels 30. Furthermore, while the channels 30 are illustrated on the side of the apparatus 21, other designs to allow the melt 10 to flow are possible.

Figure 4:
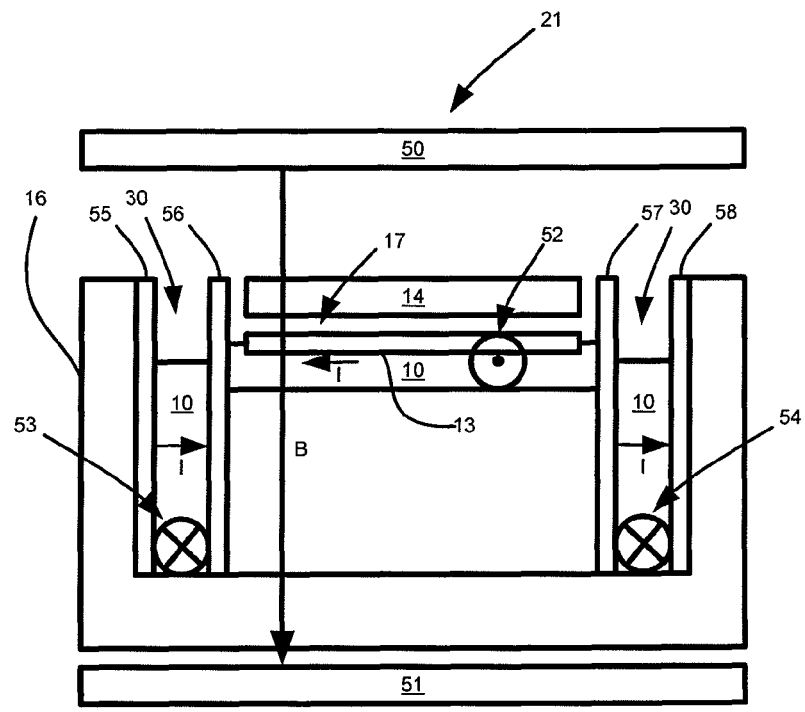
FIG. 4 is a cross-sectional front view of the embodiment of the apparatus shown in FIG. 1 using a magnetohydrodynamic pump.

FIG. 4 is a cross-sectional front view of the embodiment of the apparatus shown in FIG. 1 using a magnetohydrodynamic (MHD), or Lorentz, pump. Coils 50, 51 are disposed above and below the apparatus 21 in this embodiment and produce a vertical magnetic field (B) within the apparatus 21. The plates 56, 57 on the side of the melt 10 provide a DC current in the melt 10 within the channel 17. The plates 55, 56, 57, 58 also provide a DC current in the melt 10 within the channels 30. The plates 55 and 56, the plates 56 and 57, and the plates 57 and 58 may be connected to at least one DC power supply to produce currents (I) in the melt 10. This will produce magnetic forces 52, 53, 54 based on the vector cross-product F=I×B, where F is the force measured in Newtons, I is the current measured in Amperes, and B is magnetic field measured in Tesla. This Lorentz force provides a pumping action within the melt 10 and the melt 10 may flow due to the magnetic fields. The current flowing through the melt 10 also may heat the melt 10, but may not heat the sheet 13.

Figure 5:
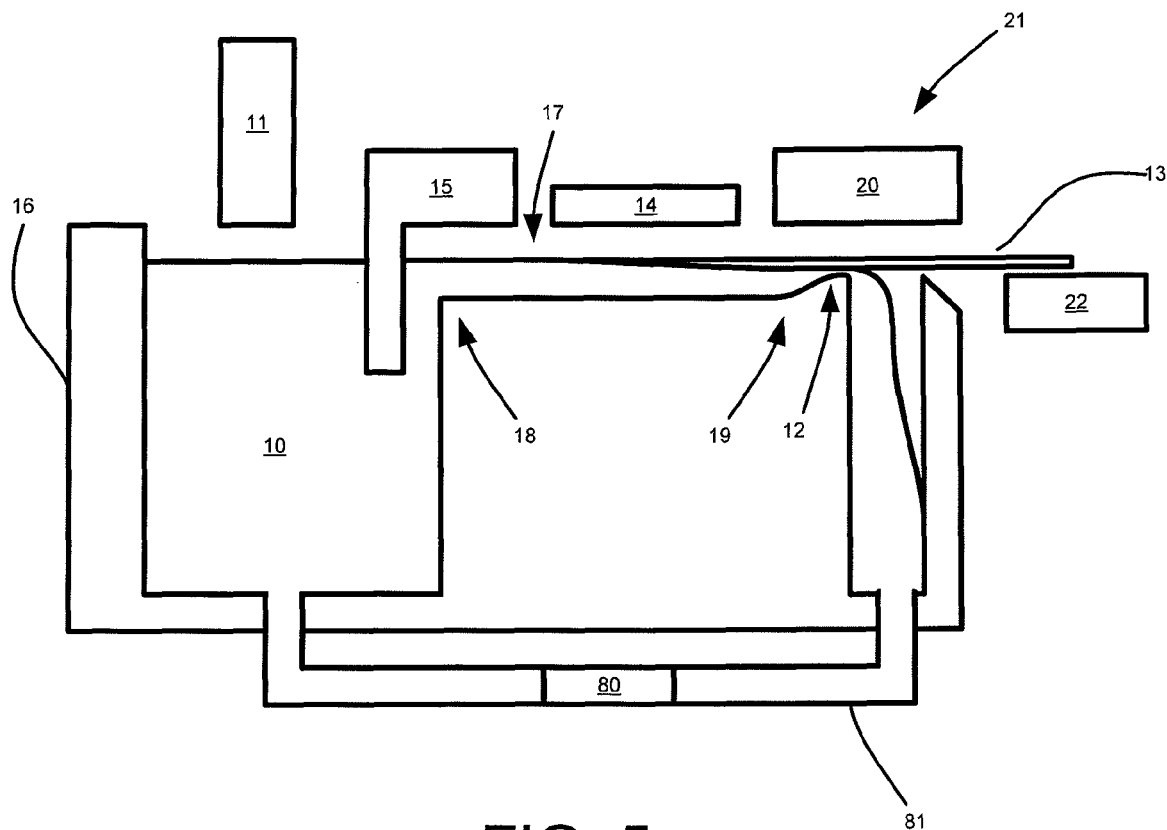
FIG. 5 is a cross-sectional side view of the embodiment of the apparatus shown in FIG. 1 using a magnetohydrodynamic pump.

FIG. 5 is a cross-sectional side view of the embodiment of the apparatus shown in FIG. 1 using a MHD pump. The apparatus 21 in this embodiment includes a single channel 81. This MHD pump 80 may allow laminar flow of the melt 10 through the apparatus 21 by magnetic and electric forces. The MHD pump 80 includes a magnetic field and current similar to that illustrated in FIG. 4, but this occurs in the channel 81 rather than the apparatus 21. The melt 10 may flow against gravity using a MHD pump 80.

Figure 6:
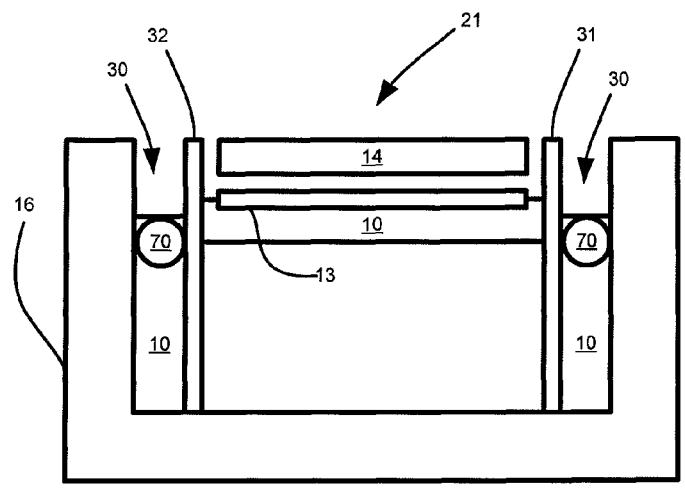
FIG. 6 is a cross-sectional front view of the embodiment of the apparatus shown in FIG. 1 using a screw pump.
Figure 7:
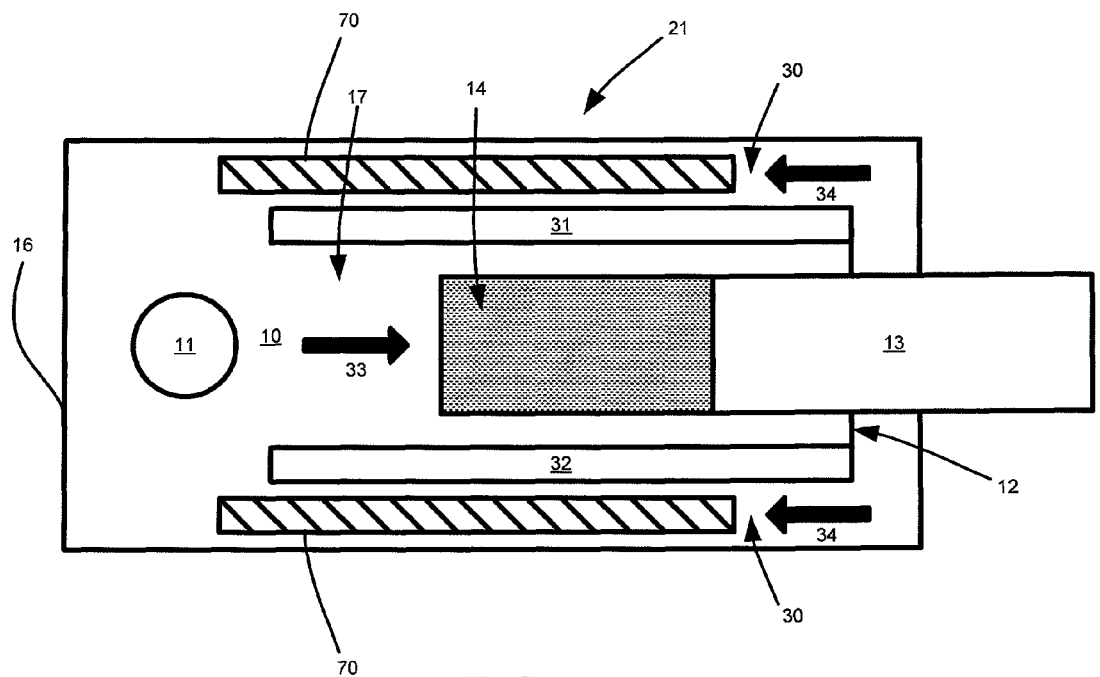
FIG. 7 is a top plan view of the embodiment of the apparatus shown in FIG. 1 using a screw pump.

FIG. 6 is a cross-sectional front view of the embodiment of the apparatus shown in FIG. 1 using a screw pump. The apparatus 21 includes a screw pump 70 in each channel 30. These screw pumps 70 may be made out of silicon carbide and may enable continuous pumping of the melt 10 within the channels 30. FIG. 7 is a top plan view of the embodiment of the apparatus shown in FIG. 1 using a screw pump. The screw pumps 70 may extend all or part of the length of the channels 30.

In another embodiment, a pump is used to cause the melt 10 to flow through the apparatus 21. In one instance, this pump is an impeller pump. In yet another embodiment, a wheel is used to lift the melt 10 and give the melt 10 the proper head to cause the desired flow rate. Of course, one skilled in the art will understand that other pumping methods may be used and that the apparatus 21 is not limited solely to the pumping methods described herein. Furthermore, one skilled in the art will recognize other designs and configurations of the apparatus 21.

Figure 8:
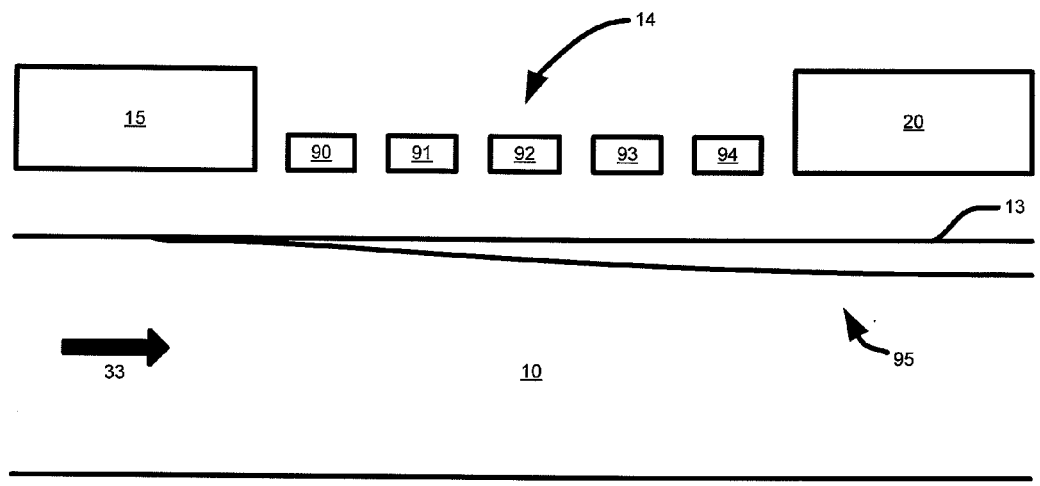
FIG. 8 is a cross-sectional side view of an embodiment of freezing a sheet on a melt.

FIG. 8 is a cross-sectional side view of an embodiment of freezing a sheet on a melt. The melt 10 is flowing as indicated by arrow 33. The melt 10 will pass under the panel 15, cooling plate 14, and panel 20 in this particular embodiment. The melt 10, panel 15, and panel 20 may be maintained at $T_c$ or slightly higher. The cooling plate 14 in this embodiment is segmented and includes the cooling segments 90, 91, 92, 93, 94. Each cooling segments 90, 91, 92, 93, 94 may be at a different temperature, an approximately similar temperature, or may be configured to allow a different amount of heat transfer from the melt 10. The cooling plate 14 will cool the melt 10 to form the sheet 13 as the melt 10 flows past the cooling plate 14. Based on at least time and the flow velocity of the melt 10, the rate of crystallization of the sheet 13 is controlled at each cooling segment 90, 91, 92, 93, 94. The dimensions of each cooling segment 90, 91, 92, 93, 94 may be configured to affect the rate of crystallization. The ability to control the heat transfer from the melt 10 to each cooling segment 90, 91, 92, 93, 94 may allow the rate of crystallization of the sheet 13 to be controlled.

Figure 9:
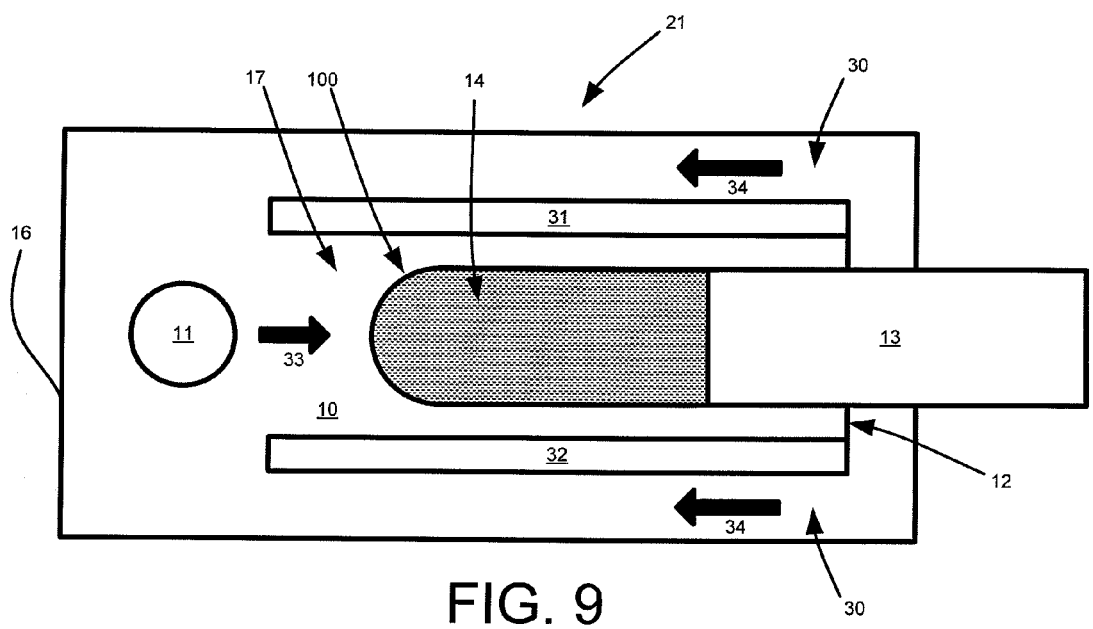
FIG. 9 is a top plan view of the embodiment of the apparatus shown in FIG. 1 with a shaped cooling plate.

FIG. 9 is a top plan view of the embodiment of the apparatus shown in FIG. 1 with a shaped cooling plate. The cooling plate 14 includes at least one edge 100 that is curved. This allows the shape of the sheet 13 to be controlled as it forms in the melt 10. In this particular embodiment, the sheet 13 will be initially narrower than its final width as it passes under the edge 100. As the sheet 13 continues to flow under the cooling plate 14, it will expand to its final width. This may promote migration of defects and grain boundaries to a controlled location of the sheet 13 and may provide better crystal boundary creation. In one instance, the grains of the sheet 13 move toward the edge of the sheet 13 due to the curved shape of the leading edge 100.

The flow rate of the melt 10 may be varied as a form of process control. In one instance, this flow rate of the melt 10 may be approximately 1 cm/s. The timing under the cooling plate 14 may be altered by changing this flow rate and this may improve the growth or change the thickness of the sheet 13.

Maintaining the $T_c$ also may allow the sheet 13 to be annealed, further enhancing the quality of the sheet 13. To avoid constitutional instability due to the presence of solutes in the melt 10, a small vertical temperature gradient may be maintained in the melt 10. For example, this vertical temperature gradient may be approximately 1 K/cm. This may produce a vertical temperature gradient in the sheet 13 as it is formed. After the sheet 13 is formed, it flows under the panel 20, which may be maintained at the same temperature as the melt 10. Then there is no longer a vertical temperature gradient in the sheet 13 and a strain develops in the sheet 13, which requires annealing. The panel 20 may enable the strain to be annealed, reducing the possibility of dislocations in the sheet 13.

Dendrite growth on the sheet 13 may be controlled. In a first instance, controlling germanium and contaminant levels in the melt 10 may reduce germanium-induced or contaminant-induced dendrite growth or roughness on the surface 95 of the sheet 13. In a second instance, roughness or dendrites on the surface 95 are repaired through polishing, oxidation, or etching.

Figure 10:
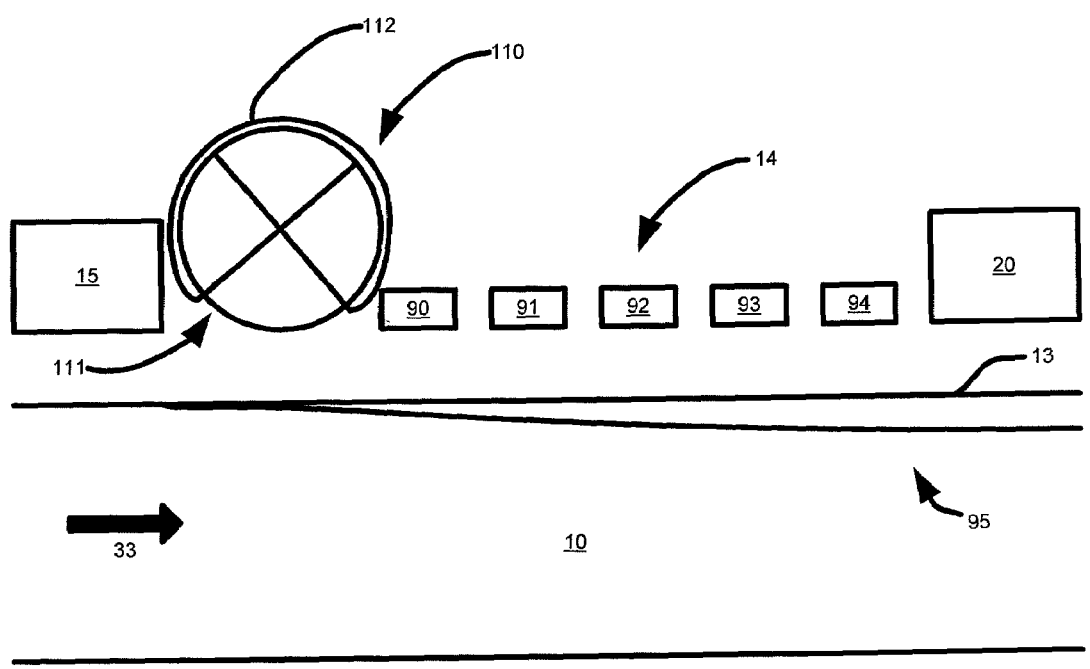
FIG. 10 is a cross-sectional side view of the embodiment of the apparatus shown in FIG. 1 with a cooling wheel.

FIG. 10 is a cross-sectional side view of the embodiment of the apparatus shown in FIG. 1 with a cooling wheel. A cooling wheel 110 with at least one cooling surface 111 surrounded by a radiation shield 112 may assist in formation of the sheet 13. The cooling wheel 110 may operate independent of the emissivity of the melt 10. In this particular embodiment, the cooling wheel 110 operates with the cooling segments 90, 91, 92, 93, 94. The cooling surface 111 may be, for example, graphite. In one example, the cooling surface 111 is approximately 40 μm thick graphite. The cooling surface 111 may begin operation at a temperature such as, for example, approximately 1000 K. Each cooling surface 111 will remove a certain amount of heat from the melt 10 before coming to the equilibrium temperature $T_c$ and beginning to produce the sheet 13. The cooling surface 111 may come to equilibrium with the melt 10 at $T_c$ in approximately 0.3 seconds and may absorb latent heat to create a sheet that is approximately 10 μm thick in one example. Because each cooling segment 90, 91, 92, 93, 94 comes to thermal equilibrium with the sheet 13 independent of the rate of heat flow from the melt 10, the heat transfer may be independent of the emissivity of the melt 10. The cooling wheel 110 may then rotate to allow the next amount of heat transfer as the sheet 13 flows to the cooling segments 90, 91, 92, 93, 94 as indicated by arrow 33.

Figure 11:
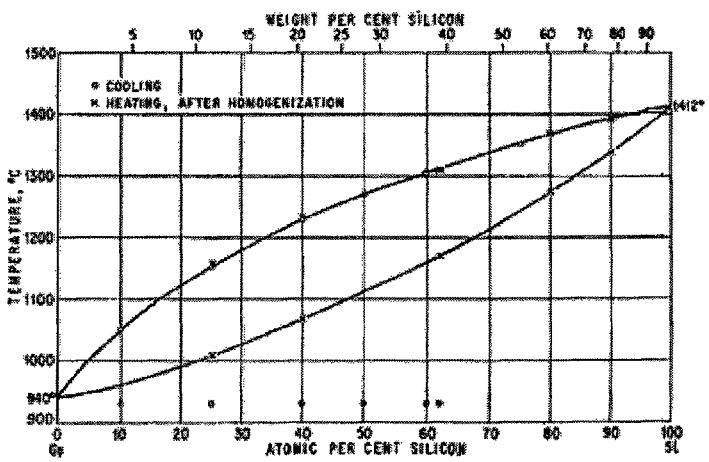
FIG. 11 is a binary phase diagram for a silicon and germanium system.

In one instance, only silicon is added to the melt 10. However, in some embodiments, silicon and germanium may be added to the melt 10 to maintain a desired proportion of silicon to germanium. This may be achieved by adding solid silicon or solid germanium to the melt 10 using the feed 11. The melt 10 may be maintained in an inert atmosphere to avoid oxidation in one embodiment. FIG. 11 is a binary phase diagram for a silicon and germanium system. Solid silicon (ρ of approximately 2.4 g/cm$^3$) will freeze at the surface of pure liquid silicon (ρ of approximately 2.6 g/cm$^3$) at the crystallization temperature of 1414° C. (1687 K).

Germanium may be added to the silicon in the melt 10 in one embodiment. Adding germanium to the silicon in the melt 10 may enable faster growth of the sheet 13 and may allow for variations in the lattice parameter that can compensate for defects in the sheet 13. If germanium is added to the silicon in the melt 10, germanium may preferentially remain in the liquid melt 10. The exact concentration depending on the flow speed of the melt 10 or the exact melt 10 composition. Since the solid crystal sheet 13 will have a lower germanium concentration and, thus, a higher melting temperature than the remaining melt 10, it will be stable against temperature fluctuations. Also, silicon may coat the vessel 16 and panel 15 if a silicon-germanium mixture is used in the melt 10. This may reduce contamination of the melt 10 by the materials the vessel 16 and panel 15 are fabricated of because the silicon coating may seal these surfaces. The temperature of the vessel 16 and panel 15 may be configured to allow this coating to form.

The resulting solid film will contain some germanium. If the germanium is less than approximately 5% of the melt 10, this will only give a small reduction in band gap in the sheet 13. The band gap is an energy range in a solid where no electron states exist. For a solar cell, the band gap determines what portion of the solar spectrum is absorbed. Adding different atoms into a crystal lattice will affect the overall band gap of the sheet 13. This is because is the different energy bands for electrons may be altered with changes to the crystal lattice. Other germanium levels are possible as known to a person of ordinary skill in the art and this embodiment is not solely limited to 5% germanium in the melt 10. Use of a solution of silicon and germanium in the melt 10 may allow fabrication of a graded bandgap solar cell from the sheet 13 with the liquid melt 10. Graded bandgap solar cells made of silicon and germanium have been made using chemical vapor deposition (CVD), but use of a silicon and germanium solution in the melt 10 eliminates a process step and may reduce production costs.

Figure 12:
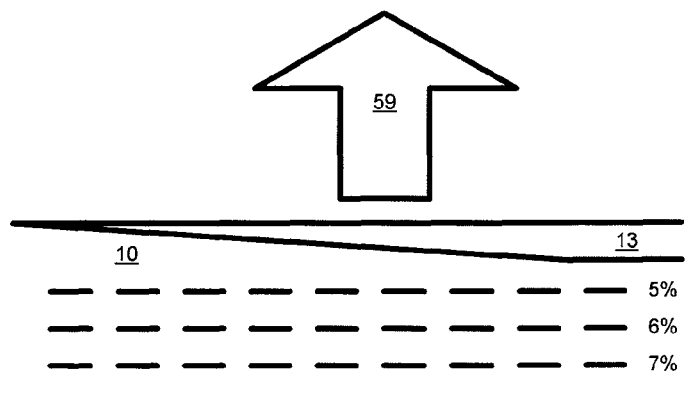
FIG. 12 is an embodiment of a graded band gap sheet.
Figure 13:
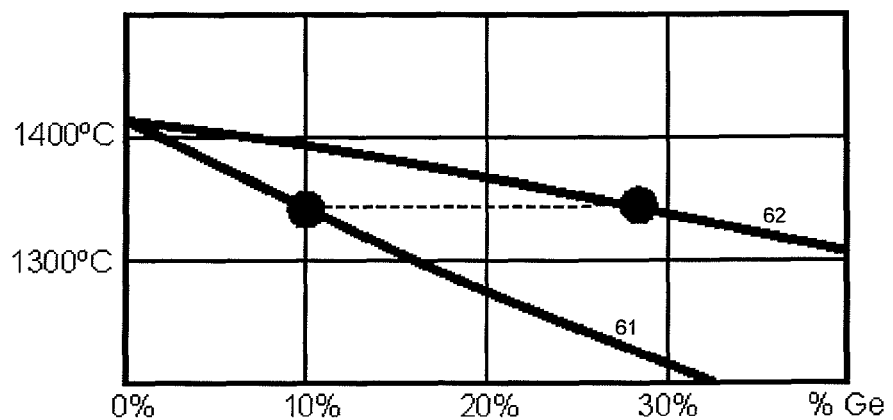
FIG. 13 is part of a binary phase diagram for a germanium system.

FIG. 12 illustrates an embodiment of a graded band gap sheet and FIG. 13 is part of a binary phase diagram for a germanium system. If a laminar flow is attained in the melt 10, the germanium concentration profile may be stable and a more pure sheet 13 may be attained. Since the density of germanium is higher than silicon, this concentration profile will also stabilize the freezing front and improve the planarity of the sheet 13. Laminar flow also may allow grading of the germanium in the melt 10. In this embodiment, a pure sheet 13 has a high percentage of silicon. As the heat transfer 59 allows the more pure sheet 13 to form on the melt 10, concentrations of germanium or other contaminants in the melt 10 may rise. FIG. 12 illustrates the approximate percent concentration of germanium in the melt 10. FIG. 13 illustrates the liquid 62 in the melt 10 and the solid 61 in the sheet 13.

Figure 14:
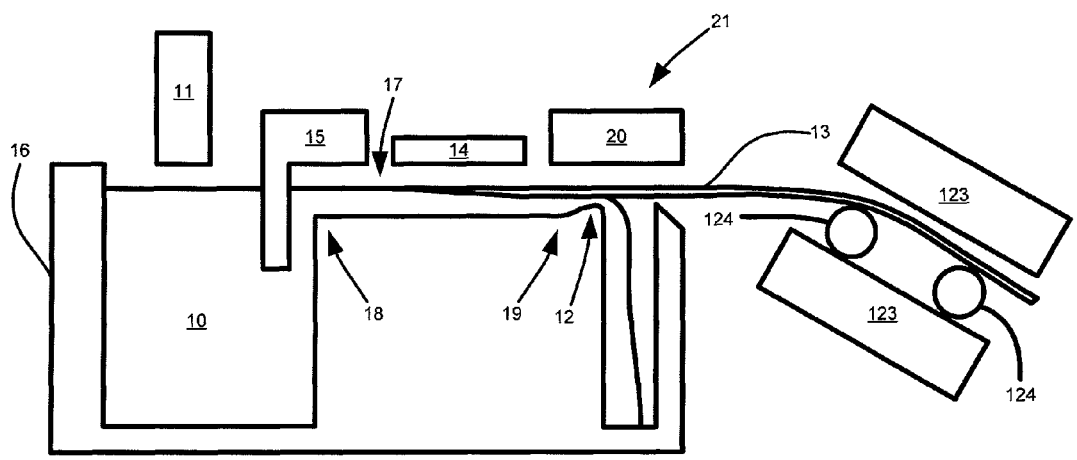
FIG. 14 is a cross-sectional side view of an embodiment of system integration.

FIG. 14 is a cross-sectional side view of an embodiment of system integration. The apparatus 21 may be incorporated into a continuous-flow integrated process tool. The sheet 13 may be processed to become an integrated circuit, solar cell, or flat panel, for example. Thus, the sheet 13 may be processed after it is produced in apparatus 21. The sheet 13 may be transported away from the melt 10 at least partly by gravity in this particular embodiment. The rollers 124 are used to at least partially support the sheet 13 as the sheet 13 is transported. The rollers 124 also may be configured to assist in transporting the sheet 13. The bending curvature of the sheet 13 may be configured to be small in one embodiment. This bending curvature of the sheet 13 may be configured to minimize mechanical stress on the sheet 13. As the sheet 13 is transported away from the melt 10, the sheet 13 may be cooled. In one example, the sheet 13 is cooled to approximately 300 K. The sheet 13 may be cooled by specific cooling devices, by elapsed time, or in process devices 123. These process devices 123 may be, for example, polishers, plasma doping, tools, deposition tools, or other process tools.

Figure 15:
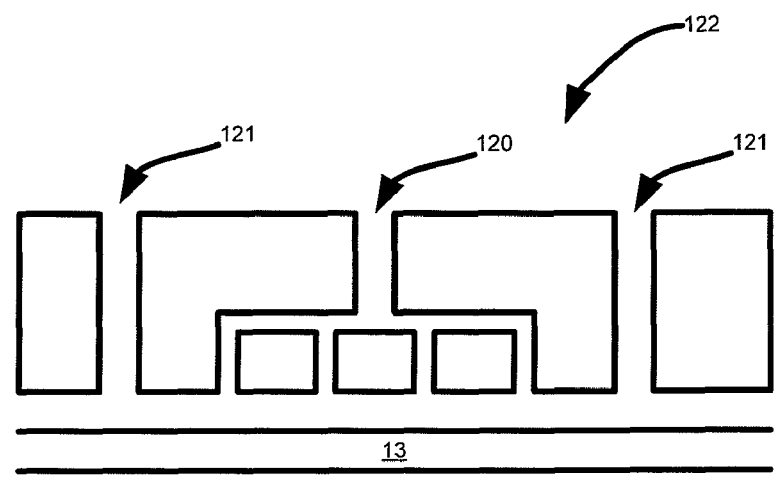
FIG. 15 is a cross-sectional view an embodiment of sheet transport using an air bearing.

FIG. 15 is a cross-sectional view an embodiment of sheet transport using an air bearing. An air bearing 122 may be used to support the sheet 13 instead of or to supplement a roller 124. The air bearing 122 pumps gas, such as argon, through inlet conduits 120. The air bearing 122 then pumps the gas through the outlet conduits 121. The seal formed by the air bearing 122 may allow gas flow at a pressure below atmosphere. Some flow velocities also may allow a Bernoulli Effect where the pressure decreases as the gas flow increases.

Figure 16:
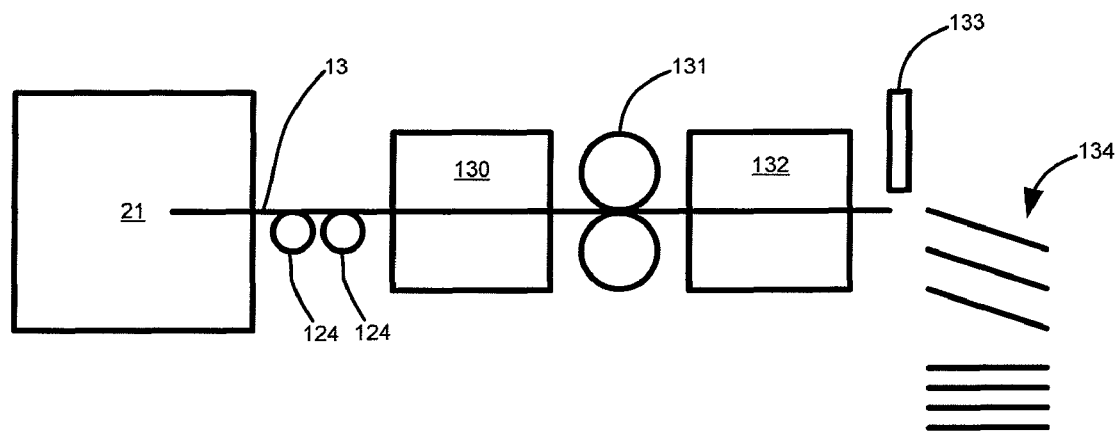
FIG. 16 is an embodiment of system integration for solar cell manufacturing.

FIG. 16 is an embodiment of system integration for solar cell manufacturing. Those skilled in the art will recognize that other system integrations are possible and that this process is not limited solely to that illustrated in FIG. 16. The sheet 13, which is predominantly silicon in this embodiment, is produced by the apparatus 21. Rollers 124 may at least partially support the sheet 13 as it leaves the apparatus 21. Junction doping may be performed using, for example, a plasma doping tool 130. The sheet 13 may be at ground potential during junction doping in the plasma doping tool 130 in one instance. In another instance, the sheet 13 is biased in the plasma doping tool 130. In an alternate embodiment, while the sheet 13 is still at a high temperature, the sheet 13 may be immersed in at least one dopant gas in a process unit to dope junctions in the sheet 13 instead of using the plasma doping tool 130. A screen printer 131 then may print the contacts on the sheet 13. A furnace 132 then allows contact sintering, hydrogenation, and annealing of the sheet 13. The sheet 13 is then scribed using a cutting apparatus 133 to form individual solar cells 134. Air bearings may be used to isolate various process sections. Those skilled in the art will recognize that section lengths may correspond to process times to allow continuous flow. In an alternate embodiment, the sheet 13 may be scribed prior to any further processing steps. Thus, the sheet 13 may be scribed after leaving the apparatus 21.

Figure 17A:
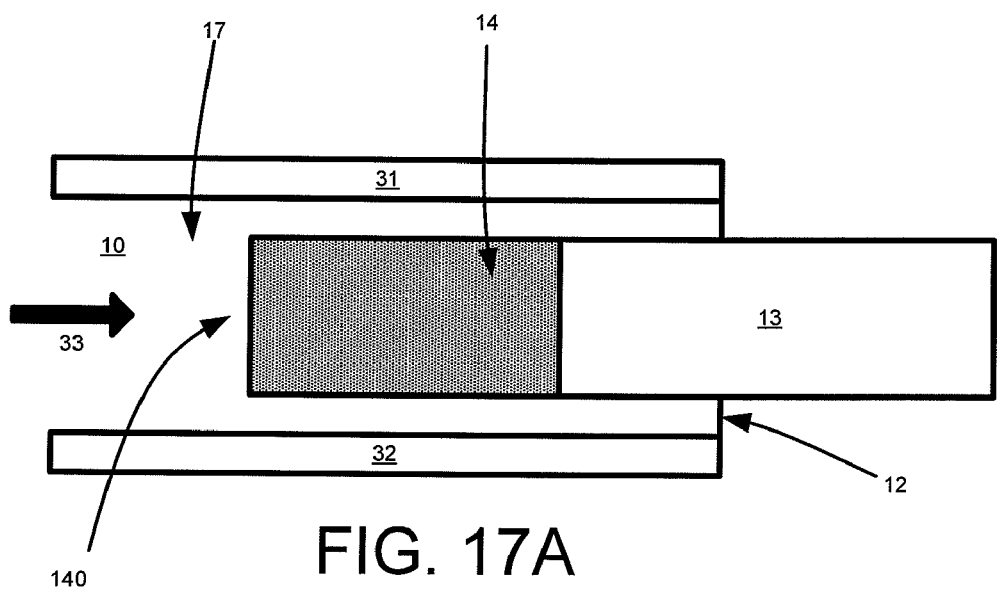
FIGS. 17A-C illustrate an embodiment of grain boundary control.
Figure 17B:
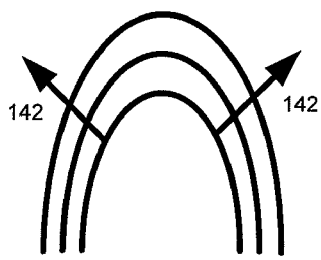
Figure 17C:
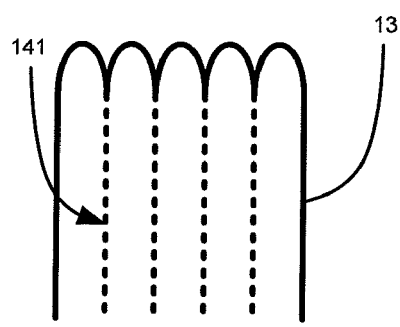

FIGS. 17A-C illustrate an embodiment of grain boundary control. As seen in FIG. 17A, the walls 31, 32 contain the melt 10 in the channel 17. The melt 10 flows in the direction illustrated by arrow 33 toward the cooling plate 14. The leading edge 140 of the cooling plate 14 may introduce a temperature gradient. The cooling plate 14 also may have other temperature gradients, such as along the length of the cooling plate 14 with the flow of the melt 10. In another instance, the cooling plate 14 may have a uniform temperature over its entire area.

In this particular embodiment, the leading edge 140 has a varying temperature with a series of high and low temperature areas across the width of the sheet 13. As seen in FIG. 17B, this varying temperature at the leading edge 140 may make individual crystals spread toward the warmer regions. This is illustrated by arrows 142. This may produce an array of grain boundaries 141 in the sheet 13, as seen in FIG. 17C. Controlling the temperature gradient across the leading edge 140 may allow the strain to be annealed. Peak strain may occur at the edge of the sheet 13 at a maximum temperature gradient. If the temperature gradient is kept to less than approximately 1000° C./m, a sheet 13 that is 2.5 m wide may be produced. Use of a single curved growth boundary may generate a single crystal sheet 13. In an alternate embodiment, temperature gradients are controlled and the growth of the sheet 13, annealing of the sheet 13, and separation from the melt 10, occurs in an isothermal environment.

Deliberate periodic temperature fluctuations may be used in one embodiment. This may control grain boundaries in the sheet 13 or may improve grain quality. Period temperature fluctuations also may form a single crystal sheet 13, improve solar cell efficiency, or cause crystal growth at particular angles.

Figure 18:
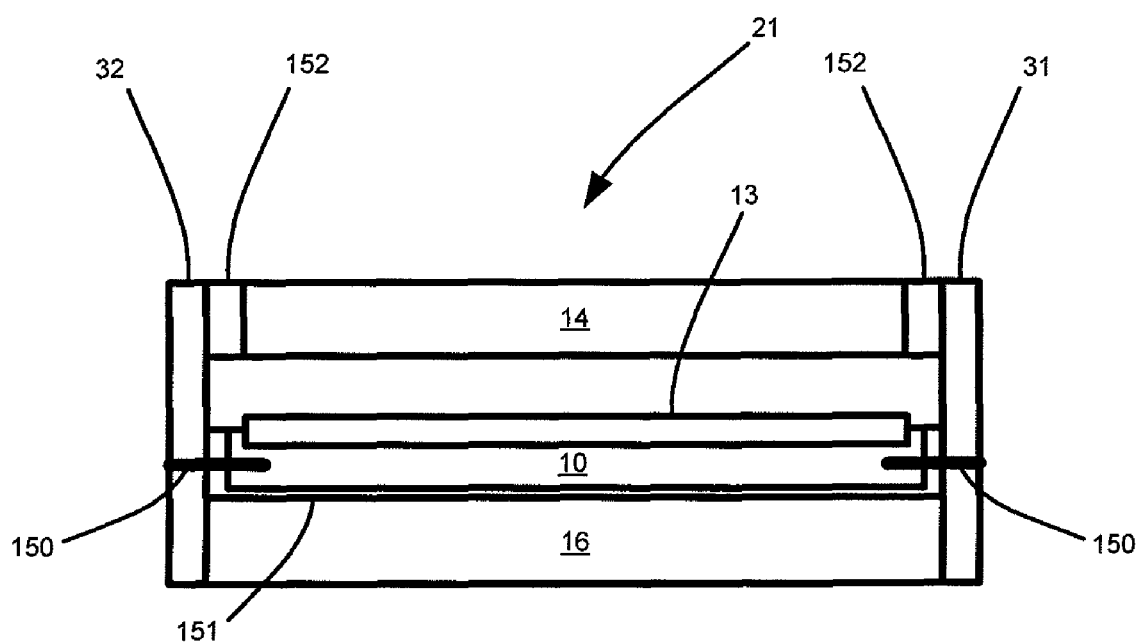
FIG. 18 is a cross-sectional front view of an embodiment of ohmic heating.

FIG. 18 is a cross-sectional front view of an embodiment of ohmic heating. In this embodiment, the melt 10 is surrounded by a layer of frozen silicon 151. This may reduce contamination in the sheet 13 that enters the melt 10 from the walls 31, 32 or the vessel 16. While the temperature of the frozen silicon 151 is below $T_c$, the temperature of the melt 10 and sheet 13 may be kept at a higher temperature due to ohmic heating. This ohmic heating may be performed with the electrodes 150. The electrodes 150 may be fabricated of tungsten. The electrodes 150 may be approximately the same length along the flow of the melt 10 as the cooling plate 14. Heating zones 152 may control temperature and crystal growth at the edge of the sheet 13 nearest the walls 31, 32. Factors such as the magnetic field for transporting the melt 10 or stabilizing convection currents in the melt 10, current density (J) for propulsion and heating, the depth of melt 10 for viscous drag and convection, and the temperature of the surroundings for heating and freezing the melt 10 and sheet 13 may be controlled.

Figure 19:
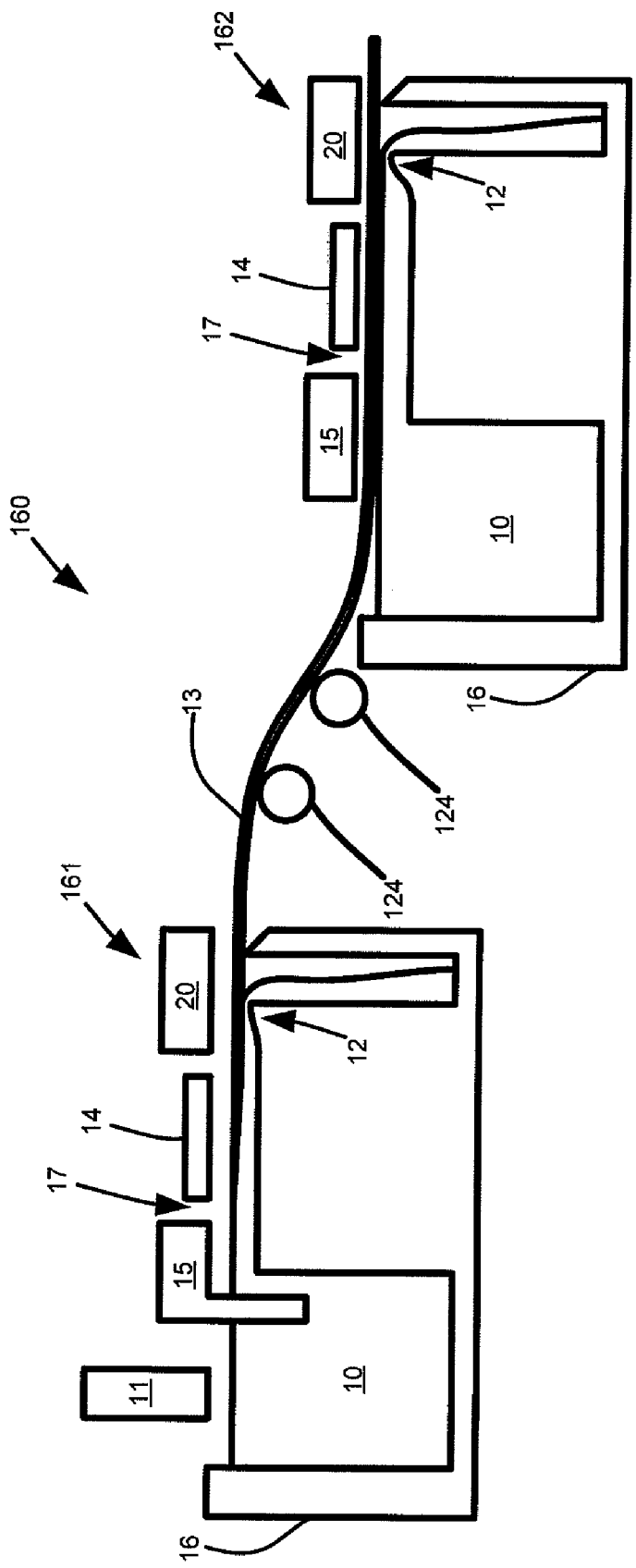
FIG. 19 is a cross-sectional side view of another embodiment of sheet manufacturing.

FIG. 19 is a cross-sectional side view of another embodiment of sheet manufacturing. The system 160 includes a first apparatus 161 and a second apparatus 162 with rollers 124. While the first apparatus 161 and second apparatus 162 are illustrated, more than two may be used in the system 160. The first apparatus 161 and second apparatus 162 may correspond to the apparatus 21 of FIG. 1. After the sheet 13 is formed on the melt 10 in the first apparatus 161, the sheet 13 is transported to the second apparatus 162. The sheet 13 will then pass through the melt 10 in the second apparatus 162. The second apparatus 162 may thicken or add additional material to the sheet 13. Additional process steps may occur after the second apparatus 162. The melt 10 in the first apparatus 161 may be different from the melt 10 in the second apparatus 162. In one particular embodiment, processing steps may be performed between the first apparatus 161 and the second apparatus 162.

In one example, solar cells may require layers of differing semiconductor material with decreasing band gaps to take advantage of the entire spectrum of light. The second apparatus 162 may add an additional layer to the sheet 13 by allowing the sheet 13 to contact the melt 10 in the second apparatus 162. The melts 10 of the first apparatus 161 and the second apparatus 162 may have varying properties, compositions, or $T_c$. The thickness added to the sheet 13 by the second apparatus 162 may be controlled by the cooling plate 14 in the second apparatus 162. The melt 10 in the second apparatus 162 may be flowing or, in another instance, may be at rest.

Figure 20:
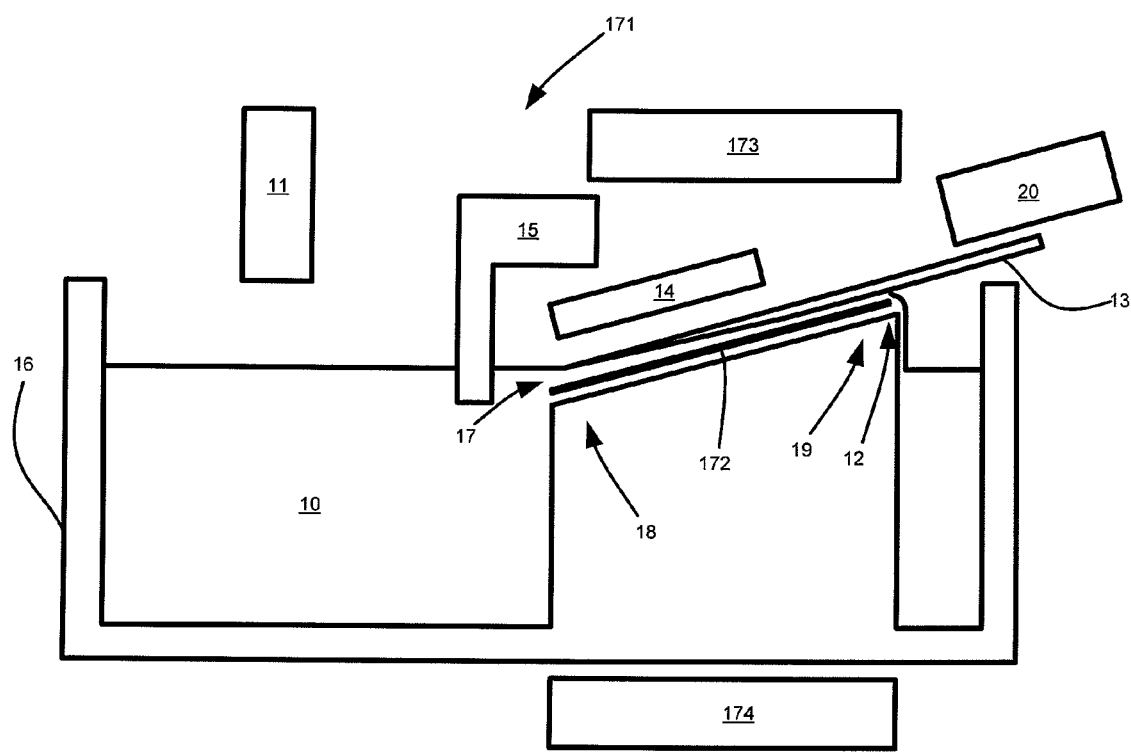
FIG. 20 is a cross-sectional side view of an alternate embodiment of an apparatus that separates a sheet from a melt.

FIG. 20 is a cross-sectional side view of an alternate embodiment of an apparatus that separates a sheet from a melt. The apparatus 171 includes a MHD electrode 172. The MHD electrodes 172 on both sides of the melt 10 may be fabricated of tungsten and drives the melt 10 from the first point 18 to the second point 19 of the channel 17 under the cooling plate 14. A first magnet 173 and a second magnet 174 are disposed around the melt 10 and generate a vertical magnetic field. The first magnet 173 and second magnet 174 may be disposed in the approximate same region of the apparatus 171 as the MHD electrodes 172. The MHD electrode 172 may be capable of forcing the melt 10 up an incline as seen in FIG. 20. The maximum angle is given by the formula $\theta = JB/(\rho g)$, where: J is the current density (A/m$^2$), B is the magnetic field (T), $\rho$ is the density (2,600 kg/m$^3$), and g is the acceleration due to gravity (9.81 m/s$^2$)

In one example, B is approximately 2.5 kG, which is approximately 0.25 T, and J is approximately 100 A/(1 m×1 mm), which is approximately 1E5A/m$^2$. For this example, $\theta$ can be as large as 1 radian. The architecture of FIG. 20 allows the melt 10 to be at approximately the same height except at the spillway 12. This may simplify the design of the apparatus 171 and may eliminate other pumping within the apparatus 171.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A sheet production method comprising:
   flowing a melt of a material through a channel;
   cooling said melt;
   forming a sheet of said material on said melt;
   flowing said sheet with said melt after said forming; and
   separating said sheet from said melt.

2. The sheet production method of claim 1, wherein said sheet and said melt are comprised of silicon or silicon and germanium.

3. The sheet production method of claim 1, wherein said separating is performed using a spillway.

4. The sheet production method of claim 1, wherein said cooling is radiative cooling.

5. The sheet production method of claim 1, further comprising fabricating a solar cell with said sheet using a continuous-flow apparatus.

6. The sheet production method of claim 1, further comprising transporting said sheet through a second melt and thickening said sheet in said second melt.

7. A product formed using the method of claim 1.

8. The sheet production method of claim 1, wherein said sheet and a surface of said melt flow at approximately the same speed prior to said separating.

9. The sheet production method of claim 1, wherein said melt falls away from said sheet during said separating.

10. The sheet production method of claim 1, wherein said sheet floats on said melt.

11. A sheet production method comprising:
flowing a melt of a material through a channel;
cooling a surface of said melt;
forming a sheet of said material on said surface of said melt;
flowing said sheet with said melt after said forming; and
separating said sheet from said melt.

12. The sheet production method of claim 11, wherein said sheet and said melt are comprised of silicon or silicon and germanium.

13. The sheet production method of claim 11, wherein said separating is performed using a spillway.

14. The sheet production method of claim 11, wherein said cooling is radiative cooling.

15. A product formed using the method of claim 11.

16. The sheet production method of claim 11, wherein said sheet and said surface of said melt flow at approximately the same speed prior to said separating.

17. The sheet production method of claim 11, wherein said melt falls away from said sheet during said separating.

18. A sheet production method comprising:
flowing a melt of a material through a channel;
cooling a surface of said melt in a first region;
freezing a sheet of said material on said surface of said melt in said first region;
flowing said sheet with said melt after said freezing to a second region different from said first region; and
separating said sheet from said melt in said second region.

19. The sheet production method of claim 18, wherein said sheet and said melt are comprised of silicon or silicon and germanium.

20. The sheet production method of claim 18, wherein said cooling is radiative cooling.

* * * * *